US006765229B2

(12) United States Patent
Zhang et al.

(10) Patent No.: US 6,765,229 B2
(45) Date of Patent: Jul. 20, 2004

(54) METHOD FOR PRODUCING SEMICONDUCTOR DEVICE

(75) Inventors: Hongyong Zhang, Kanagawa (JP); Yasuhiko Takemura, Shiga (JP); Toru Takayama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/985,394

(22) Filed: Nov. 2, 2001

(65) Prior Publication Data

US 2002/0047118 A1 Apr. 25, 2002

Related U.S. Application Data

(60) Division of application No. 09/532,899, filed on Mar. 22, 2000, now Pat. No. 6,337,231, which is a division of application No. 08/935,338, filed on Oct. 2, 1997, now Pat. No. 6,090,646, which is a continuation of application No. 08/477,943, filed on Jun. 7, 1995, now abandoned, which is a continuation-in-part of application No. 08/248,219, filed on May 24, 1994, now abandoned.

(30) Foreign Application Priority Data

May 26, 1993 (JP) ............................................. 5-147002

(51) Int. Cl.⁷ .............................................. H01L 29/76
(52) U.S. Cl. ............................ 257/57; 257/49; 257/50; 257/51; 257/66; 257/70; 257/72; 257/74; 257/345; 257/350
(58) Field of Search ............................. 257/70, 49–51, 257/57, 66, 385, 72, 74, 754, 345, 350

(56) References Cited

U.S. PATENT DOCUMENTS

| | | | |
|---|---|---|---|
| 3,692,574 A | 9/1972 | Kobayashi | |
| 3,749,614 A | 7/1973 | Boleky | |
| 4,309,224 A | 1/1982 | Shibata | |
| 4,319,395 A | 3/1982 | Lund et al. | |
| 4,406,709 A | 9/1983 | Celler et al. | |

(List continued on next page.)

FOREIGN PATENT DOCUMENTS

| | | | |
|---|---|---|---|
| EP | 251 767 | * | 1/1988 |
| EP | 0 390 608 | | 10/1990 |
| EP | 0 480 178 | | 4/1992 |

(List continued on next page.)

OTHER PUBLICATIONS

Kawazu et al., "Low–Temperature Crystallization of Hydrogenated Amorphous Silicon Induced by Nickel Silicide Formation", pp. 2698–2704, Dec. 1990, Japanese Journal of Applied Physics, vol. 29, No. 12.

(List continued on next page.)

Primary Examiner—Nathan J. Flynn
Assistant Examiner—Ahmed N. Sefer
(74) Attorney, Agent, or Firm—Eric J. Robinson; Robinson Intellectual Property Law Office, P.C.

(57) ABSTRACT

A silicon film provided on a blocking film 102 on a substrate 101 is made amorphous by doping Si+, and in a heat-annealing process, crystallization is started in parallel to a substrate from an area 100 where nickel serving as a crystallization-promoting catalyst is introduced.

26 Claims, 6 Drawing Sheets

U.S. PATENT DOCUMENTS

| | | | |
|---|---|---|---|
| 4,466,179 A | | 8/1984 | Kasten |
| 4,561,171 A | | 12/1985 | Schlosser |
| 4,717,681 A | | 1/1988 | Curran |
| 4,727,044 A | | 2/1988 | Yamazaki |
| 4,740,829 A | | 4/1988 | Nakagiri et al. |
| 4,757,026 A | | 7/1988 | Woo et al. |
| 4,766,477 A | | 8/1988 | Nakagawa et al. |
| 4,772,564 A | | 9/1988 | Barnett et al. |
| 4,822,752 A | * | 4/1989 | Sugahara et al. ............ 437/174 |
| 4,897,361 A | | 1/1990 | Harriott et al. |
| 4,904,611 A | | 2/1990 | Chiang et al. |
| 4,946,799 A | | 8/1990 | Blake et al. |
| 4,951,601 A | | 8/1990 | Maydan et al. |
| 4,986,213 A | | 1/1991 | Yamazaki et al. |
| 4,992,846 A | * | 2/1991 | Sakakibara et al. ........... 357/59 |
| 5,010,033 A | | 4/1991 | Tokunaga et al. |
| 5,075,259 A | | 12/1991 | Moran |
| 5,145,808 A | | 9/1992 | Sameshima et al. |
| 5,147,826 A | * | 9/1992 | Liu et al. .................... 437/233 |
| 5,162,892 A | | 11/1992 | Hayashi et al. |
| 5,170,244 A | | 12/1992 | Dohjo et al. |
| 5,177,578 A | | 1/1993 | Kakinoki et al. |
| 5,212,101 A | | 5/1993 | Canham et al. |
| 5,242,858 A | | 9/1993 | Sakamoto et al. |
| 5,262,350 A | | 11/1993 | Yamazaki et al. |
| 5,275,851 A | * | 1/1994 | Fonash et al. .............. 427/578 |
| 5,278,093 A | | 1/1994 | Yonehara |
| 5,288,658 A | | 2/1994 | Ishihara |
| 5,289,030 A | | 2/1994 | Yamazaki et al. |
| 5,296,405 A | | 3/1994 | Yamazaki et al. |
| 5,318,661 A | | 6/1994 | Kumomi |
| 5,326,991 A | | 7/1994 | Takasu |
| 5,352,291 A | | 10/1994 | Zhang et al. |
| 5,385,863 A | * | 1/1995 | Tatsumi et al. ............. 437/109 |
| 5,403,772 A | * | 4/1995 | Zhang et al. ............... 437/101 |
| 5,422,302 A | * | 6/1995 | Yonehara et al. ............. 437/83 |
| 5,424,244 A | | 6/1995 | Zhang et al. |
| 5,439,837 A | | 8/1995 | Hata et al. |
| 5,481,121 A | | 1/1996 | Zhang et al. |
| 5,488,000 A | | 1/1996 | Zhang et al. |
| 5,492,843 A | | 2/1996 | Adachi et al. |
| 5,501,989 A | | 3/1996 | Takayama et al. |
| 5,508,533 A | | 4/1996 | Takemura |
| 5,529,937 A | | 6/1996 | Zhang et al. |
| 5,531,182 A | | 7/1996 | Yonehara |
| 5,534,716 A | | 7/1996 | Takemura |
| 5,543,352 A | | 8/1996 | Ohtani et al. |
| 5,545,571 A | | 8/1996 | Yamazaki et al. |
| 5,563,426 A | | 10/1996 | Zhang et al. |
| 5,569,610 A | | 10/1996 | Zhang et al. |
| 5,569,936 A | | 10/1996 | Zhang et al. |
| 5,580,792 A | | 12/1996 | Zhang et al. |
| 5,585,291 A | | 12/1996 | Ohtani et al. |
| 5,589,406 A | | 12/1996 | Kato et al. |
| 5,589,694 A | | 12/1996 | Takayama et al. |
| 5,595,923 A | | 1/1997 | Zhang et al. |
| 5,595,944 A | | 1/1997 | Zhang et al. |
| 5,604,360 A | * | 2/1997 | Zhang et al. ................. 257/72 |
| 5,605,846 A | | 2/1997 | Ohtani et al. |
| 5,606,179 A | | 2/1997 | Yamazaki et al. |
| 5,608,232 A | | 3/1997 | Yamazaki et al. |
| 5,612,250 A | | 3/1997 | Ohtani et al. |
| 5,614,426 A | | 3/1997 | Funada et al. |
| 5,614,733 A | | 3/1997 | Zhang et al. |
| 5,616,506 A | | 4/1997 | Takemura |
| 5,620,910 A | | 4/1997 | Teramoto |
| 5,621,224 A | | 4/1997 | Yamazaki et al. |
| 5,624,851 A | | 4/1997 | Takayama et al. |
| 5,637,515 A | | 6/1997 | Takemura |
| 5,639,698 A | * | 6/1997 | Yamazaki et al. .......... 437/228 |
| 5,643,826 A | | 7/1997 | Ohtani et al. |
| 5,646,424 A | | 7/1997 | Zhang et al. |
| 5,654,203 A | | 8/1997 | Ohtani et al. |
| 5,656,825 A | | 8/1997 | Kusumoti et al. |
| 5,663,077 A | | 9/1997 | Adachi et al. |
| 5,677,549 A | | 10/1997 | Takayama et al. |
| 5,696,386 A | | 12/1997 | Yamazaki |
| 5,696,388 A | | 12/1997 | Funada et al. |
| 5,700,333 A | | 12/1997 | Yamazaki et al. |
| 5,705,829 A | | 1/1998 | Miyanaga et al. |
| 5,712,191 A | | 1/1998 | Nakajima et al. |
| 5,739,590 A | | 4/1998 | Sakamoto et al. |
| 5,773,846 A | | 6/1998 | Zhang et al. |
| 5,789,762 A | | 8/1998 | Koyama et al. |
| 5,808,321 A | | 9/1998 | Mitanaga et al. |
| 5,818,076 A | | 10/1998 | Zhang et al. |
| 5,824,573 A | | 10/1998 | Zhang et al. |
| 5,830,784 A | | 11/1998 | Zhang et al. |
| 5,859,443 A | | 1/1999 | Yamazaki et al. |
| 5,895,933 A | | 4/1999 | Zhang et al. |
| 5,897,347 A | | 4/1999 | Yamazaki et al. |
| 5,932,893 A | | 8/1999 | Miyanaga et al. |
| 5,942,768 A | | 8/1999 | Zhang |
| 5,953,598 A | | 9/1999 | Hata et al. |
| 5,962,871 A | | 10/1999 | Zhang et al. |
| 6,037,610 A | | 3/2000 | Zhang et al. |
| 6,087,679 A | | 7/2000 | Yamazaki et al. |
| 6,090,646 A | | 7/2000 | Zhang et al. |
| 6,121,076 A | | 9/2000 | Zhang et al. |
| 6,160,279 A | | 12/2000 | Zhang et al. |
| 6,211,536 B1 | | 4/2001 | Zhang |
| 6,285,042 B1 | | 9/2001 | Ohtani et al. |
| 6,294,815 B1 | | 9/2001 | Yamazaki et al. |
| 6,426,064 B1 | | 7/2002 | Stockel et al. |
| 2001/0000011 A1 | | 3/2001 | Zhang et al. |

FOREIGN PATENT DOCUMENTS

| | | | |
|---|---|---|---|
| JP | | 53-27371 | 3/1978 |
| JP | | 54-70762 | 6/1979 |
| JP | | 57-102067 | 6/1982 |
| JP | | 59-161870 | 9/1984 |
| JP | | 60-055665 | 3/1985 |
| JP | | 60-143666 | 7/1985 |
| JP | | 61-63017 | 4/1986 |
| JP | | 61-84074 | 4/1986 |
| JP | | 62-174973 | 7/1987 |
| JP | | 63-170971 | * 7/1988 |
| JP | | 63-204769 | 8/1988 |
| JP | | 63-278217 | 11/1988 |
| JP | | 63-295065 | 11/1988 |
| JP | | 64-1273 | * 1/1989 |
| JP | | 64-011369 | 1/1989 |
| JP | | 64-049257 | 2/1989 |
| JP | | 64-050569 | 2/1989 |
| JP | | 01-125866 | 5/1989 |
| JP | | 01-15719 | 6/1989 |
| JP | | 01-270309 | 10/1989 |
| JP | | 02-098143 | 4/1990 |
| JP | | 2-140915 | 5/1990 |
| JP | | 2-159730 | 6/1990 |
| JP | | 2-222546 | 9/1990 |
| JP | | 2-237037 | 9/1990 |
| JP | | 02-260524 | 10/1990 |
| JP | | 02-275641 | 11/1990 |
| JP | | 03-029316 | 2/1991 |
| JP | | 3-280420 | 12/1991 |
| JP | | 04-091425 | 3/1992 |
| JP | | 04-137619 | 5/1992 |
| JP | | 04-305940 | 10/1992 |

| JP | 04-337626 | 11/1992 |
| JP | 05-047791 | 2/1993 |
| JP | 05-067635 | 3/1993 |
| JP | 05-109737 | 4/1993 |

OTHER PUBLICATIONS

C. Hayzelden et al., "*In Situ* Transmission Electron Microscopy Studies of Silicide–Mediated Crystallization of Amorphous Silicon", Applied Physics Letters 60(2), Jan. 13, 1992, pp. 225–227.

A. V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640, 1986.

T. Hempel et al., "Needle–like Crystallization of Ni Doped Amorphous Silicon Thin Films", *Solid State Communications*, vol. 85, No. 11, pp. 921–924, 1993.

R. Kakkad et al., Crystallized Si films by low–temperature rapid thermal annealing of atmosphere silicon, *J. Applied. Phys.*, Mar. 1, 1989, p. 2069–2072.

G. Liu et al., "Polycrystallization silicon thin film transistors on Corning 7059 glass substrates using short time, low–temperature processing", *Appl. Phys. Lett.* 62(20), Mar 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

R. Kakkad et al., "Low Temperature Selective Crystallization of Amorphous Silicon", *Journal of Non–Crystalline Solids*, 115, 1989, pp. 66–68.

M.E. Gross et al., "Laser direct–write metallization in thin palladium acetate films", J. Appl. Phys. 61(4), Feb. 15, 1987, pp. 1628–1632.

Vivek Subramanian and Krishna C. Saraswat, "A Novel Technique for 3–D Integration: Ge–seeded Laterally Crystallized TFTs", 1997 Symposium on VLSI Technology Digest of Technical Papers, pp. 97–98.

S. Kishino et al., *Physics of VLSI Device*, Jul. 25, 1986, pp. 144–145.

T. Sato, et al., *Mobility Anisotropy of Electrons in Inversion Layers on Oxidixed Silicon Surfaces*, Physical Review b. vol. 4, No. 6, Sep. 15, 1971, pp.1950–1960.

J.A. Borders et al., Materials Research Society, Short Course Program, "Analytical Methods (A Synopsis) For use in connection with Modern Materials Analysis Techniques an MRS Short Course," Oct. 1986, pp. 62–63.

* cited by examiner

METHOD FOR PRODUCING SEMICONDUCTOR DEVICE

This is a Divisional of prior application Ser. No. 09/532,899 filed Mar. 22, 2000 now U.S. Pat. No. 6,337,231; which itself is a division of Ser. No. 08/935,338 filed Oct. 2, 1997 now U.S. Pat. No. 6,090,646; which is a Continuation of Ser. No. 08/477,943 filed Jun. 7, 1995, now abandoned; which is a Continuation-in-Part of Ser. No. 08/248,219 filed May 24, 1994, now abandoned.

BACKGROUND OF THE INVENTION

1. Field of the Invention

This invention relates to a semiconductor device having TFTs (thin film transistors) provided on an insulating substrate of glass or the like, and a method for producing the semiconductor device.

2. Description of Related Art

TFTs have been conventionally formed on a glass substrate to form a semiconductor device such as an active matrix liquid crystal device or an image sensor. The TFTs are used, for example, to drive the pixels of the liquid crystal device.

The TFTs used in the above devices are generally formed of a silicon semiconductor layer in the form of a thin film. The silicon semiconductor of a thin-film type is classified into two types, an amorphous silicon semiconductor (a-Si) type and a crystalline silicon semiconductor type. The amorphous silicon semiconductor can be relatively easily produced at a low film-forming temperature by a vapor-phase deposition method. Therefore, this type is suitable for mass production, and it has been most generally used. However, this type of silicon semiconductor has inferior physical properties such as electrical conductivity, etc. to the crystalline silicon semiconductor. Therefore, in order to more improve a high-speed response characteristic of TFTs, a producing method for TFTs comprising crystalline silicon semiconductor has been strongly required to be established. As the silicon semiconductor having crystallinity have been known polycrystalline silicon, microcrystalline silicon, amorphous silicon containing crystal components, semi-amorphous silicon having an intermediate state between crystallinity and amorphousness, etc.

The following methods may be used to obtain thin film silicon semiconductors having the foregoing crystallinity:

(1) Crystallinity is established during the formation of the semiconductor film.

(2) An amorphous semiconductor film is formed in advance, and then a laser beam is irradiated to the film to crystalize the film.

(3) An amorphous semiconductor film is formed in advance, and then heated to crystalize the film.

However, in the method (1), it is technically difficult to form a film having excellent semiconductor physical properties on the whole surface of a substrate uniformly. In addition, the film formation must be performed at a temperature above 600° C. and thus an inexpensive glass substrate is unusable, so that a manufacturing cost is increased.

In the method (2), an excimer laser is most generally used at present as a laser beam source for irradiating a laser beam to an amorphous semiconductor film. In this case, the irradiation area of the laser beam is small, and thus this method has a disadvantage that a throughput is low. In addition, the stability of the laser beam is insufficient, so that the whole surface of a large-area substrate cannot be treated uniformly. That is, this method is not practically usable at present.

As compared to the methods (1) and (2), the method (3) has an advantage that it is more suitable to manufacture a large-area semiconductor film. However, this method requires a heating temperature above 600° C., and thus an inexpensive glass substrate is not usable. Therefore, this method must be developed to reduce the heating temperature. Particularly in case of present liquid crystal display devices, a large-area screen design is being promoted, and thus use of a large-size glass substrate is required. When a large-size glass substrate is used, contraction and distortion of a substrate occur in a heating process which is indispensable to produce semiconductors, and they cause a critical problem that the precision of a masking process is reduced. Particularly in a case of 7059 glass which is most generally used at present, it has a distortion point of 593° C., and it is greatly deformed in a conventional heat crystallization method. In addition to the heat problem as described above, a heating time required for crystallization is over several tens hours in a present process, and thus the heating time must be shortened.

SUMMARY OF THE INVENTION

An object of the present invention is to provide a method capable of solving the above problems, and specifically to provide a process for producing a silicon semiconductor thin film having crystallinity utilizing a method of heating an amorphous silicon thin film to crystallize the thin film, in which both of lowering of the temperature for crystallization and shortage of the heating time for crystallization can be performed. A silicon semiconductor having crystallinity which is manufactured using the process according to this invention has the same physical properties as or physical properties superior to that manufactured by a conventional technique, and it is usable in an active layer area of TFTs.

The inventors of this application have made the following experiments and consideration for a method of forming an amorphous silicon semiconductor film as described above by a CVD method or a sputtering method, and then heating the film to crystalize the film.

An amorphous silicon film is initially formed on a glass substrate, and then the film is crystallized by heating. The inventors investigated the mechanism of this crystallization. Through the experiments, it was observed that crystal growth of silicon starts at an interface between the glass substrate and the amorphous silicon and proceeds vertically to the substrate surface into a pillar shape in the case that the thickness of the film is larger than a certain thickness.

The above phenomenon is considered as progressing on the basis of a mechanism that crystalline nuclei serving as geneses for crystal growth (species serving as geneses for crystal growth) exist between the glass substrate and the amorphous silicon film, and crystal grow from the crystalline nuclei. These crystalline nuclei are considered as being impurity metal elements or crystal components (as is called as a crystallized glass, it is considered that crystal components of silicon oxide exist on the surface of the glass substrate) existing on the surface of the substrate in a very small amount.

Accordingly, it is expected that a crystallization temperature can be lowered by introducing crystal nuclei more positively. In order to confirm an effect of introducing crystal nuclei, the following experiment was tried. That is, a thin film of different metal in a very small amount was beforehand formed on a substrate, then an amorphous silicon thin film was formed on the different metal film, and then heat-crystallization was conducted on the amorphous silicon thin film. As a result, it was proved that the crystallization temperature was lowered when thin films of some different kinds of metal were beforehand formed on the substrate, and it was expected that crystal growth using foreigners as crystal nuclei had conducted. Accordingly, a more detailed mechanism for plural kinds of impurity metal which could lower the crystallization temperature was studied.

The crystallization mechanism can be considered to be classified into two stages which are an initial nucleus generation stage and a subsequent crystal growth stage from the nuclei. The speed of the initial nucleus generation can be detected by measuring a time elapsing until spotted fine crystals occur at a constant temperature. This time could be shortened in all cases where the thin films of the above kinds of impurity metal were formed on the substrate, and the effect of the introduction of the crystal nuclei on the lowering of the crystallization temperature can be proved. As an unexpected result, through an experiment for examining variation of growth of crystal grains with variation of the heating time after generation of crystal nuclei, it was observed that the speed of the crystal growth after the generation of the nuclei was also rapidly increased when a thin film of a certain kind of metal was formed on a substrate, an amorphous silicon thin film was formed on the metal thin film and then the amorphous silicon thin film was crystallized. A mechanism for this effect has not yet been elucidated at present, however, it is guessed that any catalytic effect acts.

At any rate, it was proved that when a thin film was formed of a certain kind metal in a very small amount, an amorphous silicon thin film was formed on the metal thin film and then the amorphous silicon thin film was crystallized by heating, sufficient crystallinity which had not been expected in the prior art could be obtained at a temperature below 580° C. and for about 4 hours due to the two effects as described above. Nickel (Ni) is the best material which is experimentally proved as providing the most remarkable effect in all impurity metals having such an effect. In addition to nickel, Fe, Co, Pd and Pt may be listed as a metal element having such a catalytic action on crystallization.

The following is an example showing an effect of formation of a nickel thin film. In a case where an amorphous silicon thin film was formed by a plasma CVD method on a substrate (coring 7059 glass) which had been subjected to no treatment, that is, on which no nickel thin film had been formed, and then heated under a nitrogen atmosphere to crystallize the amorphous silicon thin film, a heating time over ten hours was required for a heating temperature of 600° C. On the other hand, in a case where an amorphous silicon thin film was formed on a substrate on which a nickel thin film in a very small amount (hereinafter referred to as a trace nickel thin film) had been formed, the same crystal state as the former case could be obtained by heating the amorphous silicon thin film for about 4 hours. The crystallization of the amorphous silicon thin film was judged using a Raman spectrum in this experiment. From this experiment, it is apparent that nickel has a large effect.

As is apparent from the foregoing, formation of an amorphous silicon thin film after a trace nickel thin film is formed enables the lowering of the crystallization temperature and the shortening of the crystallization time. This process will be described in more detail on the assumption that this process is applied to a TFT producing process. As described later, the same effect can be obtained by forming a nickel thin film on not only a substrate, but also on an amorphous silicon thin film, or by implanting the nickel into the amorphous silicon by an ion implantation method. Accordingly, these treatments are commonly referred to as "trace nickel addition" in the specification of this application.

First, a method for the trace nickel addition will be described.

It has been known that the trace nickel addition can provide the same effect on the lowering of the crystallization temperature in both cases where a trace nickel thin film is formed on a substrate and then an amorphous silicon thin film is formed on the trace nickel thin film, and where an amorphous silicon film is formed and then a trace nickel thin film is formed on the amorphous silicon film, and any film-forming method such as a sputtering method, a deposition method, spin coating, coating or the like may be used as a film-forming method. However, in the method of forming the trace nickel thin film on the substrate, the effect becomes more remarkable by forming a silicon oxide film on a 7059 glass substrate and then forming the trace nickel thin film on the silicon oxide film than by directly forming the trace nickel thin film on the substrate. As one of reasons for this fact, it would be considered that direct contact between silicon and nickel is important for the low-temperature crystallization, and components other than silicon serves to obstruct direct contact or reaction between silicon and nickel in the case of using a 7059 glass substrate.

It was proved that the substantially same effect could be obtained by adding nickel with the ion implantation method as well as the method of forming the trace nickel thin film in contact with the lower surface or upper surface of the amorphous silicon thin film as described above. The lowering of the crystallization temperature was observed for addition of nickel of $1 \times 10^{15}$ atoms/cm$^3$ or more. However, it was observed that for addition of nickel of $1 \times 10^{21}$ atoms/cm$^3$ or more, the shape of the peak of a Raman spectrogram was clearly different from that of silicon itself, so that a practically usable range of nickel addition is from $1 \times 10^{15}$ atoms/cm$^3$ to $5 \times 10^{19}$ atoms/cm$^3$. If a nickel concentration is $1 \times 10^{15}$ atoms/cm$^3$ or less, nickel elements are localized and thus the catalytic function of nickel is deteriorated. Further, if a nickel concentration is $5 \times 10^{19}$ atoms/cm$^3$ or more, nickel and silicon are reacted with each other to form NiSi compounds, and the semiconductor characteristics are hindered. In a crystallized state, products can be more practically used as a semiconductor as the nickel concentration is lower.

On the basis of the above consideration and the fact that products are used as active layers or the like of TFTs, the nickel addition amount is required to be adjusted in the range of $1 \times 10^{15}$ atoms/cm$^3$ to $1 \times 10^{19}$ atoms/cm$^3$.

Next, crystal form when the trace nickel addition is performed will be described.

As explained below, in the case that nickel is not added, crystallization occurs from crystal nuclei existing at the substrate surface. This crystallization proceeds in a random direction provided that the film is not thicker than a certain thickness. Further, if the thickness of the film is enough large, the columnar crystals grow in such a manner that the (110) direction aligns vertically to the substrate surface. This crystallization can be observed on the entire surface of the substrate. On the other hand, in the case of the trace nickel addition according to this embodiment, different crystal growth was observed between an area added with nickel (hereinafter referred to as "nickel area") and an area in the neighborhood of the nickel area (hereinafter referred to as "adjacent area"). That is, it became clear from a transmission electron microscopic photograph that, in the nickel area, added nickel or a compound of nickel and silicon served as a crystal nucleus and the pillar-shaped crystal growth progressed substantially vertically to the substrate. In addition, the low-temperature crystallization was also confirmed in the adjacent area in which the nickel was not directly added, and a peculiar crystal growth in which needle or pillar shape crystals grew substantially in parallel to the substrate so that the (111) plane was aligned vertically to the substrate was also observed in this area.

It was observed that the crystal growth in the lateral direction parallel to the substrate was started from the nickel area and the maximum crystal size of grown crystals extended to several hundreds μm, and it became clear that the degree of crystal grow increases with the increase of the time and the temperature. For example, crystal growth of about 40 μm crystals was observed at the temperature of 550° C. and for 4 hours. In addition, according to a transmission electron microscopic photograph, each of these large-size laterally-extending crystals was determined to be like monocrystal. Further, the nickel concentration in each of a trace nickel added area, a laterally-extending crystal growth area in the neighborhood of the trace nickel added area and an amorphous area (no low-temperature crystallization appeared in a region extremely distant from the Ni added area) was measured by SIMS (Secondary Ion Mass Spectroscopy). As a result, the nickel concentration in the laterally-extending crystal growth area was measured to be lower than the trace nickel added area by one figure, and diffusion in amorphous silicon was observed. Further, the nickel concentration in the amorphous area was measured to be lower than the laterally-extending crystal growth area by one figure. The relationship between the crystal form and the above result has been unclear at present, however, at any rate, a silicon film having crystallinity of a desired crystal form at a desired area can be formed by adjusting a nickel addition amount and controlling a position where nickel is added.

Next, electrical characteristics of the trace nickel added area and the laterally-extending crystal growth area adjacent thereto will be described.

With respect to conductivity, the trace nickel added area had the substantially same conductivity value as a no-nickel added film, that is, the film which was subjected to crystallization at about 600° C. for several tens hours. Further, calculating an activation energy on the basis of temperature-dependence of conductivity, there was observed no behavior which was expected to be induced due to the nickel energy level when the nickel addition amount was set in the range of about $10^{17}$ atoms/cm$^3$ to $10^{18}$ atoms/cm$^3$. That is, according to only this fact, in a case where the nickel concentration in a crystal silicon semiconductor film is below $1\times10^{18}$ atoms/cm$^3$, there would occur no problem even if a semiconductor device, for example, a TFT is formed using this film.

On the other hand, the laterally-extending crystal growth area had a higher conductivity than the trace nickel added area by one or more figures, and it has a very higher value as a silicon semiconductor having crystallinity. The reason for this fact would be considered as follows. That is, a current passing direction was coincident with the laterally-growing direction of crystals, and thus there was little or no grain boundary in an electron path between electrodes. This fact is perfectly consistent with the result of the transmission electron microscopic photograph.

However, through more delicate observation of the laterally-growing area of the crystals on the transmission electron microscopic photograph, areas containing crystals growing in a branch form was also observed upon viewing from the upper side of the substrate although the crystallization direction of needle or pillar crystals was parallel to the surface of the substrate. That is, it was observed that the needle or pillar crystals grew in the same direction on the average, however, some crystals grew while being branched in a slant direction.

The inventors have deliberately considered the observation result, and had the following conclusion.

Crystal components of a substrate material existing in a substrate or at an interface portion between the substrate and a semiconductor film, or crystal components in the semiconductor film can serve as nuclei for crystal growth, however, these components obstruct the crystal growth in an uniform direction (unidirection) and promote a random crystal growth in the lateral crystal growth process.

Therefore, this invention is characterized in that crystal components at and in the vicinity of the interface between a substrate area on which the growth is to occur and an amorphous silicon semiconductor film (in this invention, the term "amorphous" does not mean a perfect amorphous state, but may contain crystal components if the amount of the components is small) are removed to the utmost by an ion implantation of inert elements so that this area is made perfectly amorphous, and then by performing the crystal growth in a lateral direction (a direction parallel to the substrate) in a state where no component serving as a crystal nucleus exists, needle or pillar crystals are grown so that the crystal growing directions thereof are coincident with one another as a whole. Particularly by concentratively implanting inert ions into the substrate, the area in the neighborhood of the surface of the substrate (when a blocking film is formed on the surface of the substrate, the blocking film is regarded as the substrate surface), the interface between the substrate and the semiconductor film and the semiconductor film itself are made perfectly amorphous, so that components having crystallinity which might serve as crystal nuclei are removed as perfectly as possible.

In accordance with another aspect of the invention, it is possible to further improve the characteristics of the thus obtained semiconductor layer by further treating the semiconductor layer with a laser light or an intense light as strong as the laser light. Thereby, components existing at grain boundaries or the like and not having been sufficiently crystallized can be further crystallized. It is assumed that the crystalline components which are produced by the preceding heating step function as nuclei so that the remaining amorphous components can be further crystallized by the photo-annealing.

The invention and its application to the actual semiconductor devices will be more fully understood from the following detailed description, when taken with the appended drawings, in which:

DETAILED DESCRIPTION OF PREFERRED EMBODIMENTS

First Embodiment

This embodiment relates to a method of forming a complementary circuit comprising a P-channel type TFT (PTFT) and a N-channel type TFT (NTFT) which are formed of crystal silicon on a glass substrate, and are complementarily connected to each other. The scheme of this embodiment is applicable to, for example, a peripheral driver circuit for an active type of liquid crystal display device or an image sensor.

FIGS. 1A to 1D are cross-sectional views showing a series of processes to manufacture a semiconductor device according to a first embodiment of this invention.

Figure 1A:
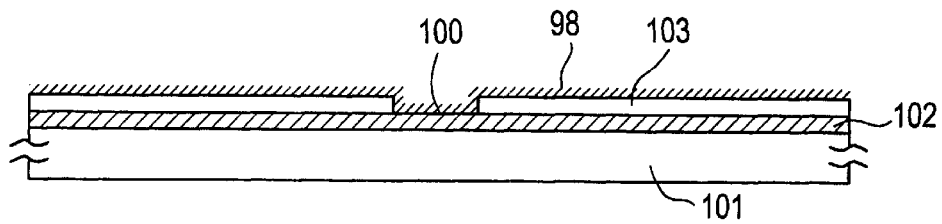
FIGS. 1A to 1D are cross-sectional views showing a series of processes of a semiconductor device producing method according to a first embodiment of this invention.

A blocking film 102 of silicon oxide is first formed at a thickness of 2000 Å on a substrate (coring 7059) 101 by a sputtering method, and then a silicon oxide film 103 serving as a mask is provided on the blocking film 102. The silicon oxide film 103 is used to expose the blocking film 102 in a slit form, and it must be designed at a thickness of 1000 Å or more. Further, it is effective to add the mask 103 with a material having a gettering effect such as phosphorus, chlorine or the like. Viewing this structure from the upper side as shown in FIG. 1A, the blocking film 102 is exposed to the outside in a slit form at region 100, and the other portion is masked.

After the silicon oxide film 103 is formed, a nickel silicide film (chemical formula: $NiSi_x$, $0.4 \leq x \leq 2.5$, for example $x=2.0$) is selectively formed at a thickness of 5 to 200 Å, for example, 20 Å in the area 100 by a sputtering method. That is, the trace nickel addition is selectively performed on the silicon oxide 102 in the area 100.

Thereafter, the silicon oxide film 103 serving as the mask is removed, and an intrinsic (I-type) amorphous silicon film 104 is formed at a thickness of 500 to 1500 Å, for example, 1000 Å. A film having crystallinity may be used as the amorphous silicon film 104, that is, any film may be used insofar as it is a non-single crystalline silicon film. Further, a silicon oxide film 99 serving as a protective film is formed at a thickness of 100 to 1000 Å. The silicon oxide film is provided to prevent the surface of the silicon film 104 from being damaged when a subsequent ion implantation is performed.

Thereafter, silicon ions which are inert elements to the silicon film 104 are implanted to the whole surface. The implantation of the silicon ions is performed to remove crystal components (silicon oxide crystal components in the substrate and crystal components in the amorphous semiconductor film) which exist at the interface between the substrate (containing the blocking film 102) and the amorphous silicon semiconductor film so that the crystal growth in the uniform direction can be performed in a subsequent heat-annealing process.

Figure 5:
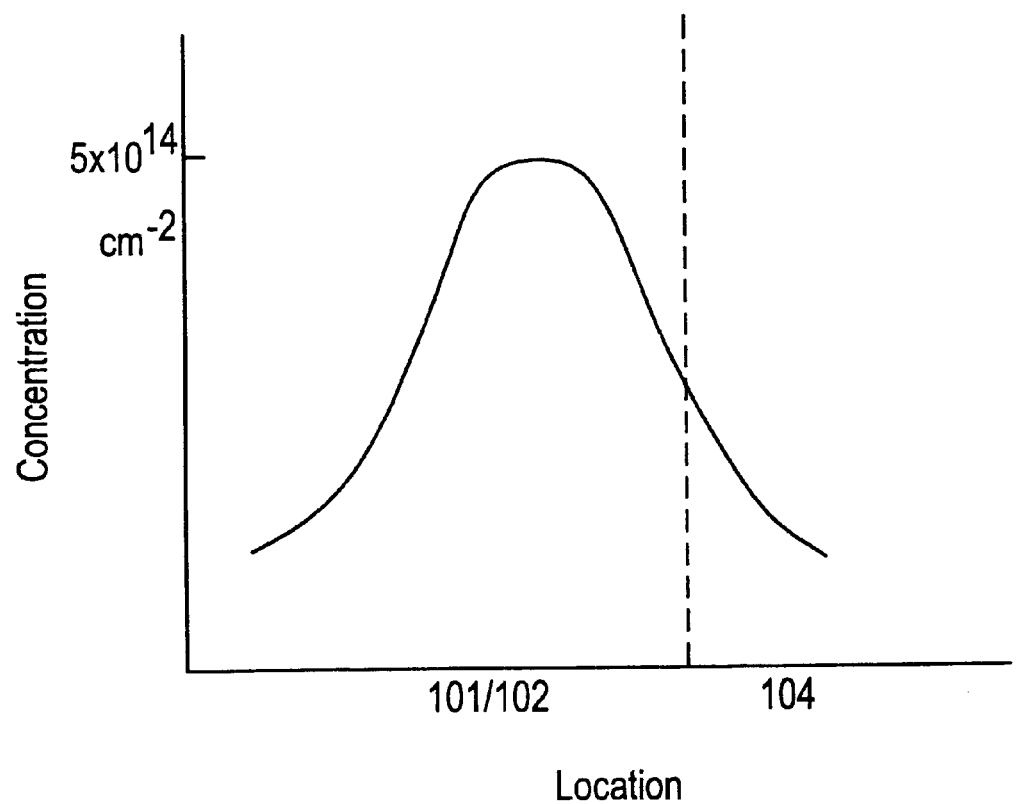
FIG. 5 is a graph showing dose of silicon ions.

Implantation conditions are set so that the silicon ions are implanted at a dose configuration as shown in FIG. 5. In FIG. 5, an area represented by a dotted line corresponds to an interface portion between the blocking film 102 and the amorphous silicon film 104. The maximum value of the dose was set to $5 \times 10^{14}$ cm$^{-2}$ at the substrate side. That is, the acceleration voltage is controlled so that the peak of the concentration locates under the silicon semiconductor layer. In the silicon-ion implantation process, the interface between the blocking film 102 (in this embodiment, the blocking film 102 is regarded as constituting the surface of the substrate) and the amorphous silicon film 104, the amorphous silicon film 104 itself, the interface between the amorphous silicon film 104 and the silicon oxide film 99, and a surrounding portion to the interface are made amorphous. The dose of the silicon ions is preferably in the range of $1 \times 10^{14}$ to $9 \times 10^{16}$ cm$^{-2}$. Also, the accelerating voltage is 137 keV, for example.

Since the surface of the amorphous silicon film is coated with the silicon oxide film 99 during the silicon-ion implantation, damage of the amorphous silicon film by accelerated ions can be suppressed. Further, it is preferable to provide a mask on the region 100 in order to prevent the implantation of the silicon ions into this area. Thereby, it is possible to prevent undesirable diffusion of nickels into other portions of the film during the implantation of silicon ions.

Thereafter, the silicon oxide film 99 is removed, and an annealing treatment is conducted at 550° C. for 4 hours under a hydrogen reducing atmosphere (preferably, partial pressure of hydrogen is set to 0.1 to 1 atm) or a nitrogen atmosphere (atmospheric pressure) to crystallize the amorphous silicon film 104. In this case, the silicon film 104 is crystallized in a direction vertical to the substrate 101 in the area 100 where the nickel silicide film has been selectively formed. In areas other than the area 100, the crystal growth proceeds in a lateral direction (a direction parallel to the substrate) from the area 100. The crystallization temperature may be set in the range of 450° C. to 700° C. If the crystallization temperature is too high, a problem in heat resistance of the glass substrate occurs like the prior art. In the present invention, it is possible to crystallize the film at a lower temperature than the conventional process at 600° C., that is, at 500° C.–580° C., preferably, 520° C.–560° C.

Since the interface between the blocking film 102 and the silicon film 104, the peripheral portion thereof and the amorphous silicon film itself are perfectly made amorphous in the laterally crystal-growing area, there occurs no crystal component serving as an element of disturbing a crystallization direction as shown by an arrow 105 when crystallization occurs, so that the lateral crystal growth can be uniformly performed.

Through the above process, the amorphous silicon film can be crystallized to obtain the crystal silicon film 104. Thereafter, a patterning process is performed to separate elements from one another, and the silicon oxide film 106 is formed at a thickness of 1000 Å as a gate insulating film by the sputtering method. In the sputtering process, silicon oxide is used as a target, and the following sputtering conditions are adopted: a substrate temperature of 200 to 400° C., for example, 350° C., and a sputtering atmosphere of oxygen and argon (argon/oxygen=0 to 0.5, for example, below 0.1). Subsequently, an aluminum film (containing silicon of 0.1 to 2%) is formed at a thickness of 6000 to 8000 Å, for example 6000 Å, by the sputtering method. It is preferable to successively carry out the film forming processes of the silicon oxide film 106 and the aluminum film.

Thereafter, the aluminum film is subjected to the patterning to form gate electrodes 107 and 109. Further, the surfaces of the aluminum electrodes are subjected to anodic oxidation to form oxide layers 108 and 110 on the surfaces thereof. The anodic oxidation is performed in an ethylene glycol solution containing tartaric acid of 1 to 5%. The oxide layers 108 and 110 thus obtained have a thickness of 2000 Å. The thickness of the oxide layers 108 and 110 serves to determine an offset gate area in a subsequent ion doping process, and thus the length of the offset gate area can be determined in the anodic oxidation process as described above.

Thereafter, impurities (phosphorus and boron) are doped into the crystal silicon film area using the gate electrode 107 and its peripheral oxide layer 108, and the gate electrode 109 and its peripheral oxide layer 110 as a mask by the ion doping method. Phosphine ($PH_3$) and diborane ($B_2H_6$) are used as doping gas. In the former case, an accelerating voltage is set to 60 to 90 kV, for example, 80 kV, and in the latter case the accelerating voltage is set to 40 to 80 kV, for example, 65 kV. The dose is set to $1 \times 10^{15}$ to $8 \times 10^{15}$ $cm^{-2}$, for example, it is set to $2 \times 10^{15}$ $cm^{-2}$ for phosphorus and $5 \times 1015$ $cm^{-2}$ for boron. In the doping process, each of these elements is selectively doped into the corresponding area while shielding the other area by a photoresist. As a result, N-type impurity areas 114 and 116 and P-type impurity areas 111 and 113 are formed, and thus a P-channel type TFT (PTFT) area and an N-channel type TFT (NTFT) area can be formed.

Thereafter, an annealing process is performed by irradiation of laser beam. A KrF excimer laser (wavelength: 248 nm, pulse width: 20 nsec) are used, however, other lasers may be used. The following irradiation conditions of laser beam are used: energy density of 200 to 400 $mJ/cm^2$, for example, 250 $mJ/cm^2$, and 2 to 10 shots, for example, 2 shots per one point. Further, it is effective to heat the substrate at about 200 to 450° C. in the laser beam irradiating operation. In the laser annealing process as described above, the irradiation of the laser beam more promotes recrystallization because nickel has been diffused into the previously-crystallized area, and thus the impurity areas 111 and 113 which are doped with the impurities providing P-type conductivity and the impurity areas 114 and 116 which are doped with the impurities providing N-type conductivity can be easily activated.

Subsequently, a silicon oxide film 118 having 6000 Å thickness is formed as an interlayer insulator by a plasma CVD method, contact holes are formed in the silicon oxide film 118, and then electrodes/wirings 117, 120 and 119 are formed of conductive material, for example, a multi-layer film of titanium nitride and aluminum. Finally, an annealing process is performed at 350° C. for 30 minutes under a hydrogen atmosphere of 1 atm. A semiconductor circuit is completed in a series of processes as described above (FIG. 1D).

Figure 1B:
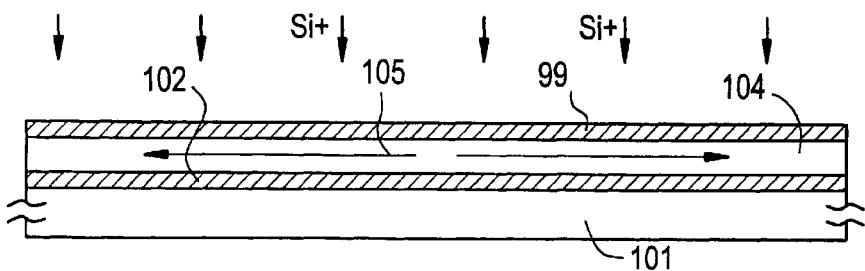
Figure 1C:
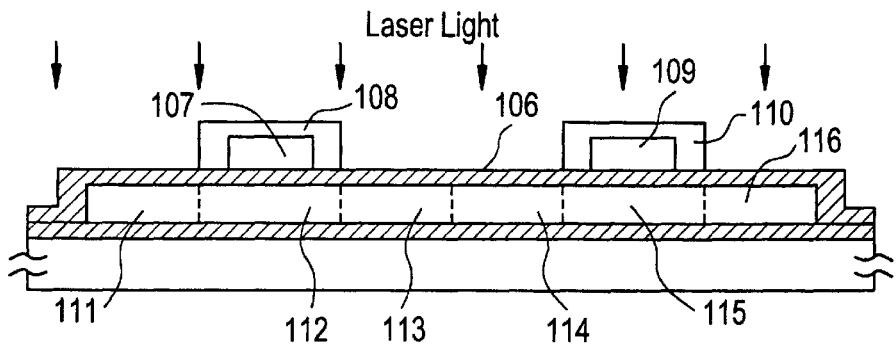
Figure 1D:
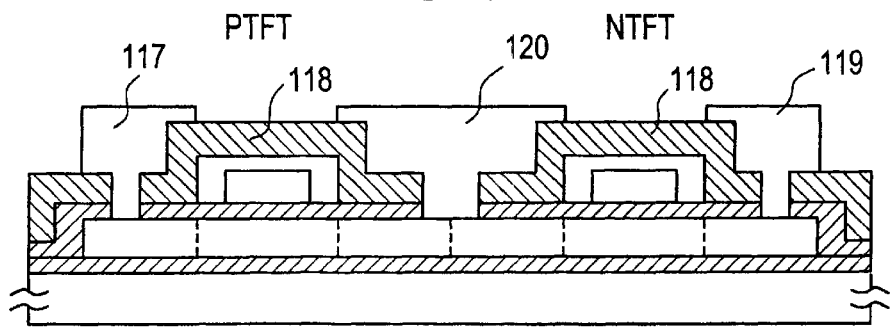

The circuit shown in FIG. 1D includes a CMOS structure in which the PTFT and the NTFT are complementarily formed, however, in the above processes, two independent TFTs may be simultaneously formed by forming two TFTs simultaneously and cutting and separating these TFTs at the center thereof.

Figure 2:
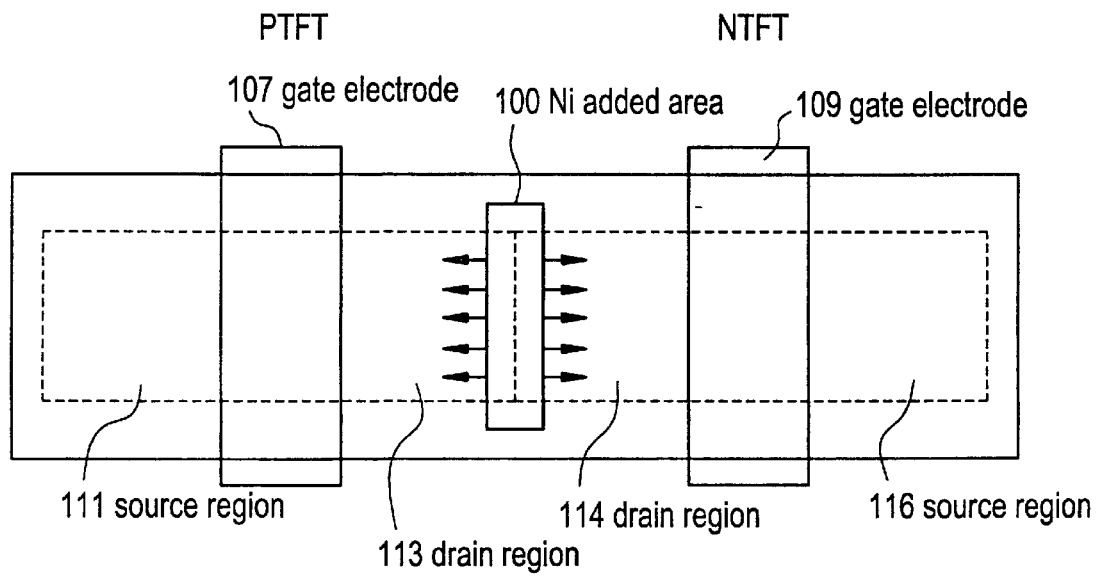
FIG. 2 is a top view of a semiconductor device as shown in FIG. 1D, which is formed by the semiconductor device producing method according to the first embodiment of this invention.

FIG. 2 is a top view of the semiconductor device shown in FIG. 1D. The Ni-added area in FIG. 2 corresponds to the area 100 shown in FIG. 1A. The lateral crystallization is started from the Ni-added area and progresses substantially uniformly in parallel to the substrate as shown in FIG. 2.

Since needle or pillar shaped crystals grow in a moving direction of carriers which move between a source and a drain, the carriers hardly traverse grain boundaries, and thus TFTs having high mobility can be obtained.

For example, when crystallization was performed without implantation of silicon ions in the process of FIG. 1B, the mobility of an obtained PTFT was 50 to 60 $cm^2/Vs$. On the other hand, the mobility of a PTFT obtained in this embodiment was 90 to 120 $cm^2/Vs$. Further, an NTFT obtained without silicon-ion implantation had a mobility of 80 to 100 $cm^2/Vs$, however, an NTFT obtained in this embodiment had a mobility of 150 to 180 $cm^2/Vs$.

In this embodiment, as an Ni doping method, the Ni thin film (as it is extremely thin, it is difficult to observe it as a film) is selectively formed on the blocking film 102 below the amorphous silicon film 104, and the crystal growth is started from this portion. However, it may be adopted that the amorphous silicon film 104 is formed and then the nickel silicide is selectively formed. That is, the crystal growth may be started from the upper surface of the amorphous silicon film, or from the lower surface of the amorphous silicon film. Further, it may be adopted that an amorphous silicon film is beforehand formed, and nickel ions are selectively doped into the amorphous silicon film 104 by the ion doping method. In this case, the concentration of Ni can be controlled. Further, the trace Ni addition can be performed by a plasma treatment. When nickel element is doped using the plasma treatment, it is sufficient to conduct the plasma treatment on the upper surface of a blocking film (silicon oxide film 102, for example) of a semiconductor film (amorphous silicon film 104, for example) which is to be subjected to the trace nickel addition, or on the upper surface of the semiconductor film.

Further, TFTs can be manufactured in the same process when Fe, Co, Pd or Pt is used as catalytic material for crystallization in place of Ni.

Embodiment 2

In this embodiment, an N-channel type TFT is provided to each picture element as a switching element in an active-type liquid crystal display device. In the following description, the structure is described for one picture element, however, other many (generally, several hundred thousands) picture elements can be made by the similar process.

FIGS. 3A to 3D are cross-sectional views showing a series of producing processes of a semiconductor device according to this embodiment. In this embodiment, a Corning 7059 glass substrate is used as a substrate 201. First, a blocking film 202 (silicon oxide film) is formed on the glass substrate 201 by the sputtering method, and then a silicon oxide film 203 serving as a mask is formed at a thickness of 1000 Å. The silicon oxide film serves as a mask for exposing the blocking film 202 to the outside in an area 204. Thereafter, a nickel silicide film is formed. (not shown in the figure) The nickel silicide film is formed at a thickness of 5 to 200 Å, for example, 20 Å by the sputtering method, and its chemical formula is represented by $NiSi_x$, $0.4 \leq x \leq 2.5$, for example, x=2.0.

Figure 3A:
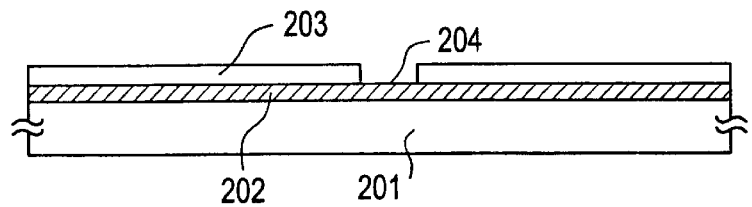
FIGS. 3A to 3D are cross-sectional views showing a series of processes of a semiconductor device producing method according to a second embodiment of this invention.
Figure 3B:
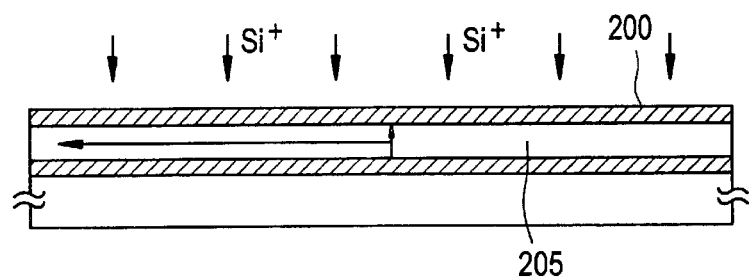
Figure 3C:
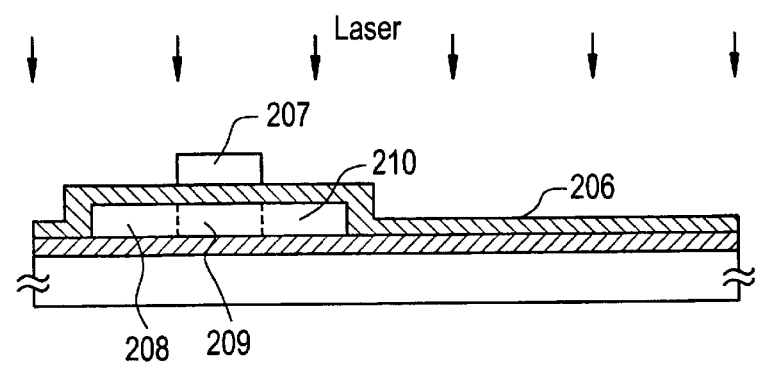
Figure 3D:
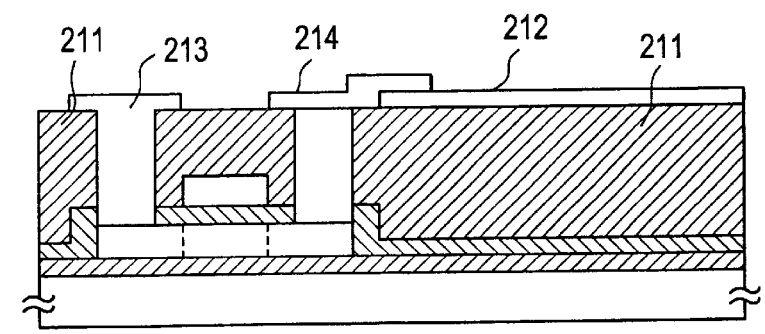

Thereafter, the silicon oxide film 203 serving as the mask is removed, an amorphous silicon film 205 (thickness: 300 to 1500 Å) is formed by an LPCVD method or a plasma CVD method, and then a protection film 200 of silicon oxide is formed at a thickness of 500 Å (FIG. 3B).

Subsequently, the same silicon-ion implantation process as the first embodiment is performed, and then the crystallization is performed by the heat-annealing treatment. This annealing process is performed at 550° C. for 4 hours under a hydrogen-reducing atmosphere (preferably, a partial pressure of hydrogen is 0.1 to 1 atom). In this case, since a nickel silicide film is partially formed below the amorphous silicon film 205, the crystal growth at a portion where the nickel silicide film is formed progresses in a vertical direction to the substrate, and the crystal growth at the other portions progresses in parallel to the substrate to obtain a crystal silicon film.

The silicon semiconductor layer 205 thus crystallized is patterned so that a semiconductor island including an active region of a TFT is formed as shown in FIG. 3B. Then a gate insulating film 206 of silicon oxide (at a thickness of 700 to 1200 Å, for example, 1000 Å in this embodiment) is formed by a plasma CVD method using tetra-ethoxy-silane (TEOS) as row material under an oxygen atmosphere.

Subsequently, a gate electrode 207 of silicon is formed, and then phosphorus is doped as N-type impurities into the crystal silicon film in a self-alignment manner by the ion doping method to form source and drain regions 208 and 209 of the TFT. Further, as shown in an arrow of FIG. 3C, KrF laser beam is irradiated to the above crystal silicon film, thereby improving crystallinity of the silicon film which is deteriorated due to the ion doping process as described above. At this time, the energy density of the laser beam is set to 250 to 300 mJ/cm$^2$. By the laser irradiation as described above, the sheet resistance of the source and drain regions of the TFT is set to 300 to 800 Ω/cm$^2$.

Thereafter, an insulating layer 211 are formed with silicon oxide, and a pixel electrode 212 are formed with ITO. Subsequently, contact holes are formed in the insulating layer 211, and electrodes 213 and 214 are formed with a multi-layer film of chromium/aluminum at the source and drain regions of the TFT so that the electrode 214 is connected to the ITO. The chromium/aluminum multi-layer film comprises a chromium film serving as a lower layer which has a thickness of 100 to 2000 nm, typically 100 nm, and an aluminum film serving as an upper layer which has a thickness of 100 to 2000 nm, typically 500 nm. It is preferable to continuously form these films by the sputtering method. Finally, the annealing treatment is conducted at 200 to 300° C. for 2 hours in a hydrogen atmosphere to complete hydrogenation of silicon. In the manner as described above, the TFT is completed. A number of TFTs which are simultaneously formed in the manner as described above are arranged in a matrix form to form an active matrix type of liquid crystal display device.

Figure 4:
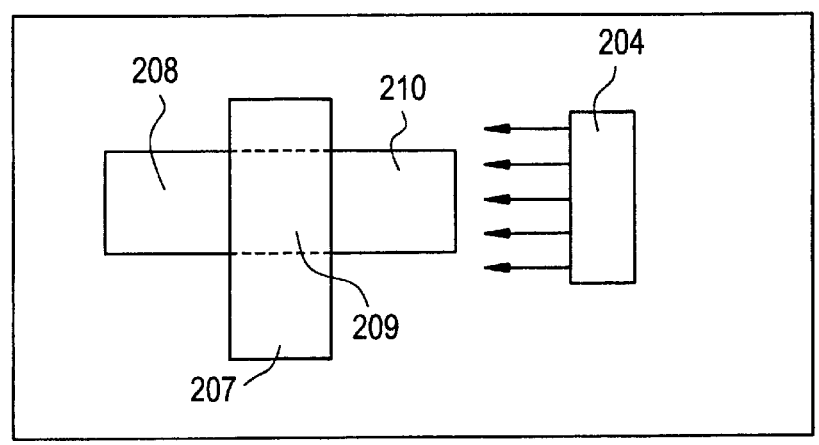
FIG. 4 is top view of a TFT which is formed by the semiconductor device producing method according to the second embodiment of this invention.

FIG. 4 is a top view of the TFT which is formed by the producing method of this embodiment.

In FIG. 4, there are shown a TFT portion, an area 204 which is subjected to the trace nickel addition, source/drain regions 208 and 210, a channel forming region 209, and a gate electrode 209 above the channel forming region. In a crystallization process using the heat-annealing treatment, the crystal growth having a uniform crystal growing direction progresses from the area 204 in which nickel is selectively introduced, in parallel to the substrate as indicated by an arrow of FIG. 4, and the source/drain regions 208 and 210 and the channel forming region 209 are constructed with a crystal silicon film which grows in parallel to the substrate. At an operation time of the TFT, carriers move along the channel forming region, that is, between the regions 208 and 210, so that the carriers can be moved in the crystal silicon film whose crystal growing direction is uniform, with suffering no effect of grain boundaries, that is, a high mobility can be obtained. Further, the lateral crystal growth progresses by about 40 μm, and thus it is preferable to set the length of an active layer to 40 μm or less. In addition, the area added with a very small amount of nickel (trace nickel added area) may be overlapped with the drain/source region 210. However, if the channel forming area 209 is overlapped with the trace nickel added area 204, the crystal growing direction would be vertical to the substrate, and thus attention must be paid to this point.

In the embodiment as described above, the TFT is formed so that the carriers flow in parallel to the crystal growing direction, however, the characteristics of the TFT can be freely controlled by suitably determining the flow direction of the carriers in the TFT and the crystal growing direction. That is, a rate at which the carriers traverse grain boundaries can be controlled by adjusting an intersecting angle between the carrier flow direction (a direction connecting the source and the drain) and the crystal growing direction in the TFT, so that resistance against movement of the carriers can be controlled to some degree.

Embodiment 3

In this embodiment, the ion doping of silicon ions is selectively performed so that an area where no silicon ion is doped is selectively left as a silicon film having crystal components, thereby enabling the lateral crystal growth to progress from this area toward an amorphous area where silicon ions are doped.

For example, in the producing process shown in FIG. 1, the trace nickel addition is selectively conducted on the area 100 like the embodiment 1, and in the producing process shown in FIG. 1B, the area 100 is masked by a resist to perform the ion doping of silicon ions. In this case, it is better to form the silicon film 104 as a film having crystallinity. In this case, the crystal growth as indicated by the arrow 105 occurs from the region 100 of the silicon film 104 toward its peripheral portion (the area doped with no silicon ion) when the heat-crystallization is performed.

Further, the same effect can be obtained by performing the trace nickel addition for the whole silicon film 104. In this case, the crystal growth in the vertical direction to the substrate 101 simultaneously occurs while nickel acts as a catalyst.

Embodiment 4

Figure 6A:
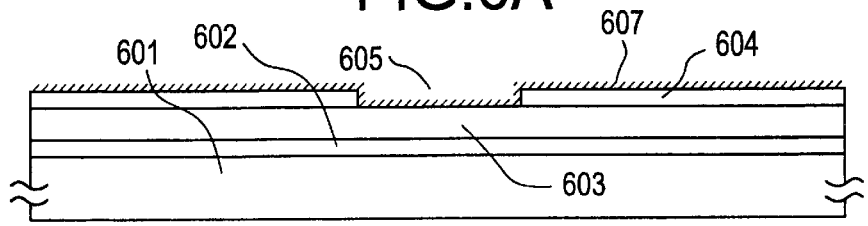
FIGS. 6A to 6E are cross-sectional views showing a manufacturing process of a semiconductor device in accordance with a fourth embodiment of the invention.
Figure 6B:
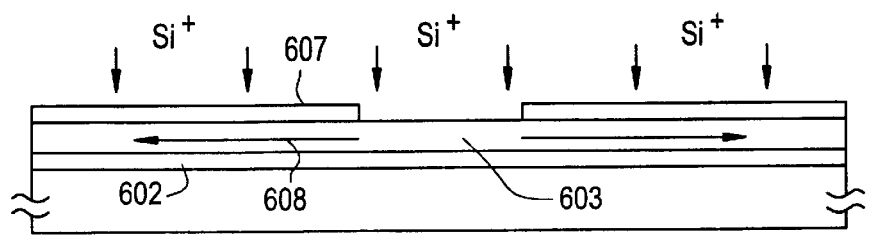

FIGS. 6A to 6E show cross-sectional views of the manufacturing process of a pair of thin film transistors in accordance with the fourth embodiment of the invention. A silicon oxide layer 602 is formed on a glass substrate 601 to a thickness of 1000–5000 Å, for example 2000 Å. Then, an amorphous silicon layer 603 is formed through a conventional plasma CVD to a thickness of 500–1500 Å, for example, 500 Å. And then, a silicon oxide layer 604 is further formed on the amorphous silicon layer 603 to a thickness of 500–1500 Å, for example 500 Å. It is desirable to form these films successively. As shown in FIG. 6A, an opening 605 is formed in the silicon oxide layer 604 by selectively etching the layer 604 in order to introduce nickel in the later step. The opening 605 is located in such a manner that it does not overlap channel regions of the TFTs to be formed within the silicon layer 603.

After forming the opening, a layer 607 containing a nickel salt is formed on the above structure by a spin-coating method as explained below.

Initially, nickel acetate or nickel nitrate is diluted with water or ethanol so that the concentration is controlled to be 25–200 ppm, for example 100 ppm. On the other hand, the substrate is immersed into a hydrogen peroxide or a mixture of hydrogen peroxide and ammonium to form an extremely thin silicon oxide layer on the exposed portion of the amorphous silicon film (in the opening 605). This will improve the interfacial affinity between the nickel solvent and the amorphous silicon layer.

Then, the substrate is placed on a spin coater and slowly rotated. The above obtained nickel solvent is dropped onto the rotating substrate at 1–10 ml, for example, 2 ml in order to spread the solvent on the entire surface of the substrate. This condition is maintained for 1–10 minutes, for example, 5 minutes. Subsequently, the rotation speed of the substrate is increased and a spin dry is performed. These steps may be performed repeatedly. Thus, a thin film 607 of a nickel salt is obtained as shown in FIG. 6A.

Next, an implantation of silicon ions is performed by an ion implantation method. At this time, the implantation is performed in such a manner that the concentration of the silicon ions is maximum at the boundary between the underlying silicon oxide layer 602 and the amorphous silicon layer 603 in the region covered with the silicon oxide 604. In the region under the opening 605, the silicon ions are more deeply implanted.

Then, the substrate is heated in a furnace at 520–580° C., for example 550° C. and for 4–12 hours, for example 8 hours. The surrounding atmosphere is nitrogen. As a result, the nickel initially diffuses into the region of the amorphous silicon under the opening 605 and a crystallization starts there. Further, the crystallization spreads to its surrounding portion as shown by arrows in FIG. 6B.

Figure 6C:
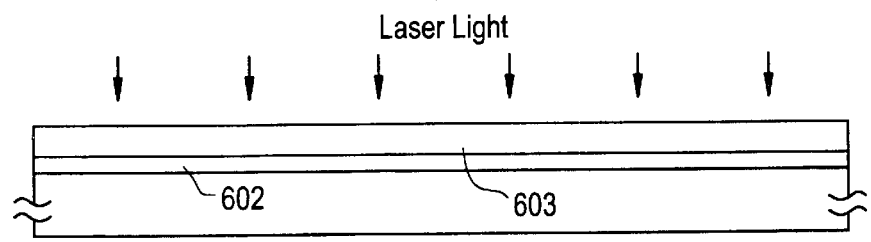

Then, in order to improve the crystallinity of the silicon layer, the layer is irradiated with KrF excimer laser (wavelength: 248 nm) or XeCl excimer laser (wavelength: 308 nm) at 1–20 shots, for example, 5 shots in air or oxygen atmosphere. (FIG. 6C)

Then, the silicon layer 603 is etched to form TFT regions. A silicon oxide layer 609 is formed on the entire surface to a thickness of 1000–1500 Å, for example, 1200 Å. Also, in the same manner as in Embodiment 1, a gate electrode 610 for a PTFT and a gate electrode 613 for an NTFT made of aluminum, an anoxic oxidation film 612, 614 are formed to obtain a gate portion of the TFT.

Figure 6D:
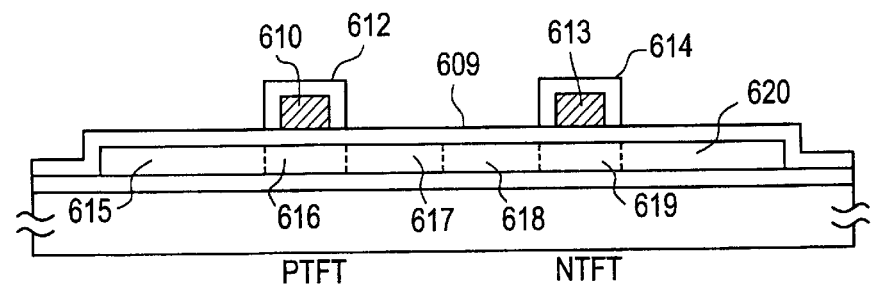

Then, an n-type impurity and a p-type impurity are respectively introduced into the semiconductor layer by using the gate portion as a mask. As a result, source 615, channel 616, drain 617 of the PTFT and source 620, channel 619 and a drain 618 of the NTF for a peripheral circuit are formed. Subsequently, a laser irradiation is performed on the entire surface of the structure in order to activate the doped impurity in the same manner as in the first embodiment. (FIG. 6D)

Figure 6E:
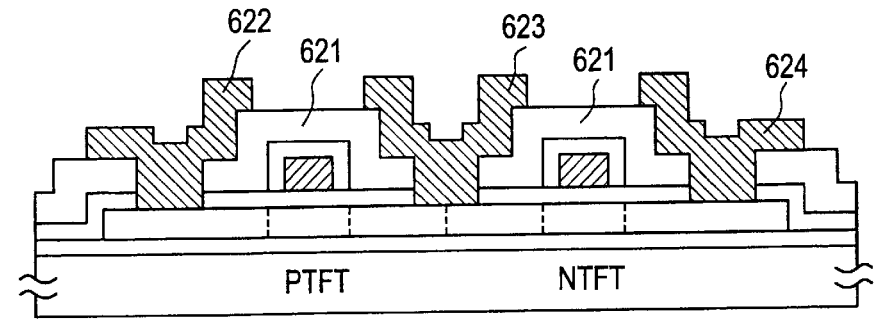

Finally, a silicon oxide layer 621 is formed to a thickness of 3000–8000 Å, for example, 5000 Å as an interlayer insulating film, following which contact holes are opened for source and drain regions of the TFTs, and a double-layer of titanium nitride (1000 Å thick) and aluminum (5000 Å) are deposited by sputtering to form electrode/wirings 622–644. In the manner described above, an invertor circuit of a PTFT and an NTFT comprising a crystalline silicon in which the crystal growth occurred in a lateral direction. (FIG. 6E)

As explained above in conjunction with FIG. 6C, since a laser irradiation is performed in this embodiment, the amorphous components remaining in a space between the needle-like crystals can be further crystallized. Moreover, this crystallization proceeds in such a manner that a cross-sectional area of the needle-like crystals become larger. This means that the region in which electrical current is to be passed is expanded and thus a more large drain current can be obtained.

Figure 7A:
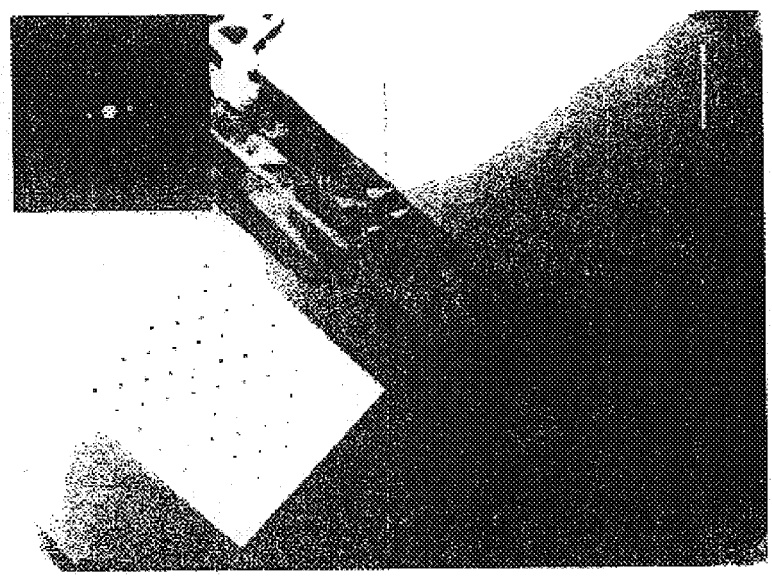
FIGS. 7A and 7B are TEM photographs of the semiconductor layer obtained in the fourth embodiment of the invention.
Figure 7B:
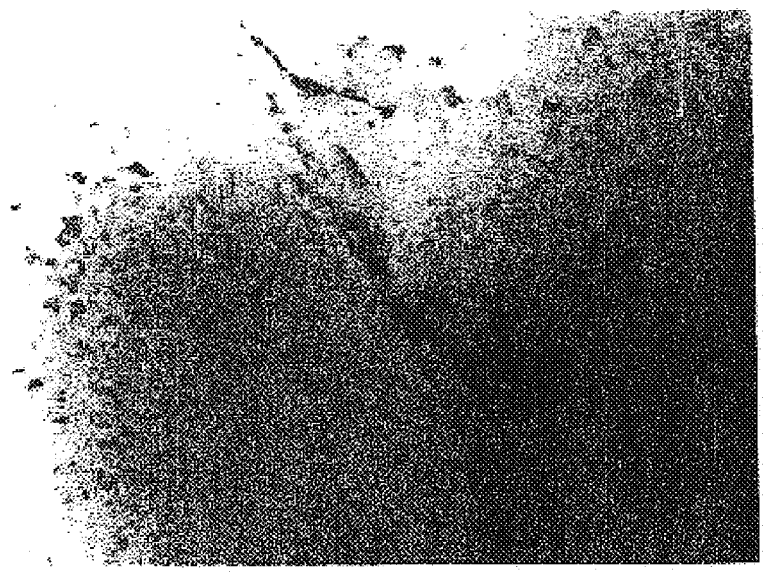

The above condition is shown in FIGS. 7A and 7B which are photographs of the silicon crystals observed with a transmission type electron microscopy (TEM). In FIG. 7A, top ends of the needle-like crystals are seen. As can been seen, the crystals grew in a lateral direction and also, there are number of amorphous regions between the crystals. This condition is observed after the heat crystallization.

FIG. 7B shows the condition when the foregoing semiconductor layer was further irradiated with a laser light in accordance with the present invention. It is observed that the amorphous region which occupies the most area of the semiconductor layer was crystallized. Most of this crystallization was randomly proceeded and an electrical property is not so good. However, it should be noted that the amorphous region intervening between the crystals as shown in FIG. 7A was crystallized based on the already formed needle-like crystals. Accordingly, a more large crystalline region in which the crystalline orientation is substantially uniform can be obtained by the subsequent laser irradiation.

FIGS. 7A and 7B are directed to the top ends of the crystals where there are observed relatively a lot of amorphous regions for the purpose of easier understanding of the above phenomena. However, the same applies to the bottom portion or a middle portion of the crystals.

According to this invention, by selectively introducing metal element promoting crystallization into a specific area and starting crystal growth from this area in a lateral direction (in parallel to a substrate), a crystal silicon film having uniform crystal growth direction can be obtained. In this case, in order to beforehand extinguish crystal components at an area where the lateral crystal growth progresses, this area is doped with inert ions to be perfectly made amorphous, and then subjected to a heat-annealing treatment to obtain a crystal semiconductor film having uniform crystal growth direction. If TFTs are manufactured using the film thus formed, high mobility can be provided to the TFTs.

Further, in accordance with another aspect of the invention, the laser irradiation subsequent to the heat crystallization reduces the amorphous region and make the crystals in the shape of a needle more larger. Thus, the characteristics of TFTs can be improved.

While this invention has been described above in connection with various preferred and alternative embodiments, it is understood that persons of ordinary skill in the art can make numerous modifications without departing from the scope of the invention as claimed in the appended claims.

These are some methods to perform solid phase crystallization by using a metal catalyst. In using such metal catalyst elements, including Ni, Fe, Co, Ru, Rh, Pd, Os, Ir, Pt, Cu, Au, etc., the conventional method was physical formation such as sputtering method, electron beam evaporation method, etc.

In this case, a film including the catalyst of 5 to 200 Å in average thickness, e.g. 10 to 50 Å thick is formed in an island-form on a surface. That is, the catalyst element is dotted on the surface in the form of micrograins with an average diameter of 50 to 200 Å. The grain are separated from each other by approximately 100 to 1000 Å. In other words, it does not form a continuous film in any way, but forms a discontinuous film. Consequently, the metal islands form nuclei for crystallization. Crystals are grown from the nuclei in an amorphous silicon film on an insulating substrate by means of a thermal treatment at 450° C. to 600° C.

In the above conventional method, the crystallization temperature can be dropped by 50 to 100° C., in comparison to when such catalyst elements are not used for the crystallization. However, the following thing became clear as a result of observing the crystallized film carefully. A number of amorphous regions are left and that such regions have a metallic property. It is presumed that the metal catalyst is left as they are.

These metal regions form recombination centers of electrons and halls. Adding a reverse bias voltage to a semiconductor device, in particular, PI or NI junction because of the metal region existing in the junction region, it has quite inferior characteristics in that a leak current is increased. When thin-film transistors of channel length/channel width=8 $\mu$m/8 $\mu$m is formed with such a semiconductor layer, the Off-state current is $10^{-10}$ to $10^{-6}$ A, which is $10^2$ to $10^6$ times larger than $10^{12}$ although an OFF=-state current should be as small as about $10^{12}$ A.

The present invention aims at giving the chemical formation method which is quite different from above. In order to solve the problem above, it is a characteristic of the present invention to form a catalytic layer by using a solution (water, isopropyl alcohol, etc.) which contains a metal organic compound at a concentration 10 ppm to 100 ppm. For example, the following metal complex salt can be used as the metal compound. Namely, ferrous bromide ($FeBr_2$ $6H_2O$), ferric bromide ($FeBr_3$ $6H_2O$), ferric acetate (Fe $(C_2H_3O_2)_3$ $xH_2O$), ferrous chloride ($FeCl_2$ $4H_2O$), ferric chloride ($FeCl_3$ $6H_2O$), ferric fluoride ($FeF_3$ $3H_2O$), ferric nitrate ($Fe(NO_3)_3$ $9H_2O$), ferrous phosphate ($Fe_3(PO_4)_2$ $8H_2O$), ferric phosphate ($FePO_4$ $2H_2O$), cobalt bromide ($CoBr$ $6H_2O$), cobalt acetate ($Co(C_2H_3O_2)_2$ $4H_2O$), cobalt chloride ($CoCl_2$ $6H_2O$), cobalt fluoride ($CoF_2$ $xH_2O$), cobalt nitrate ($Co(NO_3)_2$ $6H_2O$), ruthenium chloride ($RuCl_3$ $H_2O$), rhodium chloride ($RhCl_3$ $3H_2O$), palladium chloride ($PdCl_2$ $2H_2O$), osmium chloride ($OsCl_3$), iridium trichloride ($IrCl_3$ $3H_2O$), iridium tetrachloride ($IrCl_4$), platinic chloride ($PtCl_4$ $5H_2O$), cupric acetate ($Cu(CH_3COO)_2$), cupric chloride ($CuCl_2$ $2H_2O$), cupric nitrate ($Cu(NO_3)_2$ $3H_2O$), auric trichloride ($AuCl_3$ $xH_2O$), auric chloride ($AuHCl_4$ $4H_2O$), sodium auric tetrachloride ($AuNaCl_4$ $2H_2O$).

The above materials can be dispersed in a solution in a monomolecular form. This solution can be spread on an entire surface of a substrate by spin coating in which the solution is dropped and then the substrate is rotated at a rotational speed of 50 to 500 r.p.m.

When a silicon oxide film of 5 to 100 Å thick is formed on the surface of a silicon semiconductor in order to improve a wettability of the silicon surface with respect to the solution, this thin film can prevent the solution from becoming spot condition by the surface tension of liquid. It is also practicable to improve the wettability of semiconductor silicon without a silicon oxide film by adding a surface active agent into the solution.

In these methods, the metal catalyst atoms can be dispersed into semiconductor through the oxide film. In particular, it is possible to promote a crystallization without forming crystal nuclei in the form of grains. Therefore, it is a favorable method.

It is also useful to coat the organic metal uniformly and a UV treatment (ozone treatment) in oxygen is performed for formation of a metal oxide film. In this case, oxidized organic substance can be vaporized and removed as carbon dioxide, so it is possible to make the solid phase growth more uniform.

When the spin coating is carried out only at low rational speed, too much metal constituent for solid phase growth is apt to be supplied into the semiconductor film. Therefore, after the rotation at a low speed, the substance is rotated at 1000 to 10,000 r.p.m., e.g., 2000 to 5000 r.p.m. Thus, an excess organic metal can be eliminated from the surface of substrate and the surface can be dried sufficiently. Moreover, it is effective to control the amount of the organic metal to be formed on the surface. In the above chemical formation method, a continuous layer can be formed on a surface of semiconductor without forming nuclei of metal particles for crystallization.

A metal catalyst layer becomes inhomogeneous layer when it is formed by a physical formation method, on the other hand, it becomes homogeneous layer when it is formed by a chemical method as is the case in the present invention.

In accordance with the above new concept, the crystals can be grown far more uniformly on an entire surface of the semiconductor film when the crystallization is performed by thermal treatment which is performed at 450° C. to 650° C. Therefore, it is possible to form excellent P-I and N-I junctions by using the thus crystallized semiconductor film. In this case, the leak is controlled to be as small as $10^{-12}$ A even if a reverse bias voltage is applied.

In the case of a physical method, 90 to 100 out of 100 P-I junctions have a large leak current, that is $10^{-10}$ to $10^{-5}$ A and 50 to 70 out of 100 N-I junctions have $10^{-12}$ to $10^{-6}$ leak current. On the other hand, in the chemical method of the present invention, 5 to 20 out of 100 P-I junctions have a leak current as small as $10^{-13}$ to $10^{-8}$ A and 0 to 20 out of 100 N-I junctions have a leak current as small as $10^{-13}$ to $10^{-8}$ A. So, the present invention improves the characteristics quite remarkably because both an OFF-state current and the probability of a film that leak current is large are reduced.

Besides, the fine effect can be obtained in both P-channel TFTs (having a PIP junctions) and N-channel TFTs (having a NIN junctions) by forming the above semiconductor film on an insulating surface. Moreover, the present invention can reduce the probability by about 1 or 2 orders that TFTs having large leak current are formed. However, if the TFTs are used for making thin film IC, the probability which TFTs having large current are formed should be decreased $1/10^3$ to $1/10^9$.

In the present invention, after the thermal crystallization, a laser light having a wavelength 248 nm or 308 nm is irradiated on the surface of the semiconductor with the energy density being at 250 to 400 mJ/cm$^2$. The absorption of light is larger in the region that metal constituent exist largely compared to the silicon region crystallized. That is, the region which remains an amorphous structure becomes black optically while the crystal constituent is transparent. Because of this, the slightly remaining amorphous component can be melted by the irradiation of the laser light selectively. Further, the metal existing in the amorphous component can be dispersed to an atomic level in this manner.

As a result, it was possible to reduce the possibility that the metal regions are formed within a recrystallized film, and it was possible to reduce the leak current of a TFT to $10^{-13}$ to $10^{-12}$ A, and further, when $10^4$ to $10^8$ pieces of TFTs were manufactural, only 1–3 of them had an undesirable large leak current. This is because the metal regions which form recombination centers and cause the increase in a leak current are removed from the semiconductor film.

By spin coating in the present method, the leak current of the reversed direction i.e. Ioff is reduced by two orders, and the probability which TFTs having a large leak current exist can be reduced by two orders. Nevertheless, TFTs having a large leak current are formed. Assumably, the cause of forming such defective TFTs is that dust adheres to the surface of the semiconductor, on which organic metal concentrates. The characteristic can be improved by the improvement of experimental equipment.

An experiment was conducted in which laser light was irradiated to a film which was obtained by forming a catalyst metal through a conventional physical formation method and heat crystallizing. In this case, however, an OFF current could not be reduced at all at P-I or N-I junctions when a reverse bias voltage was applied, even if the semiconductor is fused by the irradiation of laser light for recrystallization because metal grains in the starting film tend to be too big.

Accordingly, the method which utilizes a chemical formation method for forming a continuous layer of an organic metal catalyst is entirely different from the conventional method which utilizes a physical formation method followed by a thermal crystallization process. It is clearly understood that the chemical formation method is superior.

Instead of using a solution for forming the continuous catalyst layer, it is possible to utilize a CVD method with an organic metal gas as a starting material. The method is quite effective in order to reduce both an OFF current and the probability which TFTs having a large leak current exist. Further, the process of the present invention is a homogeneous crystal growth, that is, isotropic growth by using metal catalyst. On the other hand, the process of the conventional method is a non-uniform crystal growth, that is, a non-isotropic growth by using metal nuclei.

In the present invention, there are two ways as to how the crystal growth occurs; one is that the crystals are grown in the transverse direction with the surface of the substrate and the other is that the crystals are grown in the vertical direction with the surface of the substrate from the lower side of the semiconductor to the upper side thereof or vice versa. In either case, it was possible to obtain a semiconductor having an excellent electrical characteristics.

What is claimed is:

1. A semiconductor device comprising:
 a semiconductor layer formed on an insulating surface, the semiconductor layer comprising crystallized silicon and having source, drain and channel regions therein wherein the channel region has a uniform crystal growth direction in parallel with the insulating surface; and
 a gate electrode adjacent to the channel region with a gate insulating film interposed therebetween,
 wherein the crystal growth direction in the channel region and a carrier flow direction in the channel region form an acute angle.

2. The semiconductor device according to claim 1 wherein the semiconductor layer contains a metal element selected from the group consisting of Ni, Fe, Co, Pd and Pt.

3. The semiconductor device according to claim 1 wherein the gate electrode is located over the channel region.

4. The semiconductor device according to claim 1 wherein the semiconductor layer has a thickness of 500 to 1500 Å.

5. A semiconductor device comprising:
 a semiconductor layer formed on an insulating surface, the semiconductor layer comprising crystallized silicon and having source, drain and channel regions therein wherein the channel region comprises a plurality of crystals extending in a direction in parallel with the insulating surface; and
 a gate electrode adjacent to the channel region with a gate insulating film interposed therebetween,
 wherein the extending direction of the crystals and a carrier flow direction in the channel region form an acute angle.

6. The semiconductor device according to claim 5 wherein the semiconductor layer contains a metal element selected from the group consisting of Ni, Fe, Co, Pd and Pt.

7. The semiconductor device according to claim 5 wherein the gate electrode is located over the channel region.

8. The semiconductor device according to claim 5 wherein the semiconductor layer has a thickness of 500 to 1500 Å.

9. A semiconductor device comprising:
 at least one N-channel type thin film transistor and one p-channel type thin film transistor formed over a same substrate, each of the thin film transistors comprising:
 a semiconductor layer formed on an insulating surface, the semiconductor layer comprising crystallized silicon and having source, drain and channel regions therein wherein the channel region has a uniform crystal growth direction in parallel with the insulating surface; and
 a gate electrode adjacent to the channel region with a gate insulating film interposed therebetween,
 wherein the crystal growth direction in the channel region and a carrier flow direction in the channel region form an acute angle.

10. The semiconductor device according to claim 9 wherein the semiconductor layer contains a metal element selected from the group consisting of Ni, Fe, Co, Pd and Pt.

11. The semiconductor device according to claim 9 wherein the gate electrode is located over the channel region.

12. The semiconductor device according to claim 9 wherein the semiconductor layer has a thickness of 500 to 1500 Å.

13. A semiconductor device comprising:
 at least one N-channel type thin film transistor and one p-channel type thin film transistor formed over a same substrate, each of the thin film transistors comprising:
 a semiconductor layer formed on an insulating surface, the semiconductor layer comprising crystallized silicon and having source, drain and channel regions therein wherein the channel region comprises a plurality of crystals extending in a direction in parallel with the insulating surface; and
 a gate electrode adjacent to the channel region with a gate insulating film interposed therebetween,
 wherein the extending direction of the crystals and a carrier flow direction in the channel region form an acute angle.

14. The semiconductor device according to claim 13 wherein the semiconductor layer contains a metal element selected from the group consisting of Ni, Fe, Co, Pd and Pt.

15. The semiconductor device according to claim 13 wherein the gate electrode is located over the channel region.

16. The semiconductor device according to claim 13 wherein the semiconductor layer has a thickness of 500 to 1500 Å.

17. A semiconductor device comprising:
 at least first and second thin film transistors formed over a same substrate, each of the first and second thin film transistors comprising:

a semiconductor layer formed on an insulating surface, the semiconductor layer comprising crystallized silicon and having source, drain and channel regions therein wherein the channel region has a uniform crystal growth direction in parallel with the insulating surface; and a gate electrode adjacent to the channel region with a gate insulating film interposed therebetween, wherein the crystal growth direction in the channel region and a carrier flow direction in the channel region form an acute angle, and wherein the crystal growth direction in the channel region of the first thin film transistor coincides with that of the second thin film transistor.

18. The semiconductor device according to claim 17 wherein the semiconductor layer contains a metal element selected from the group consisting of Ni, Fe, Co, Pd and Pt.

19. The semiconductor device according to claim 17 wherein the gate electrode is located over the channel region.

20. The semiconductor device according to claim 17 wherein the first thin film transistor is an N-channel type thin film transistor and the second thin film transistor is a P-channel type thin film transistor.

21. The semiconductor device according to claim 17 wherein the semiconductor layer has a thickness of 500 to 1500 Å.

22. A semiconductor device comprising:

at least first and second thin film transistors formed over a same substrate, each of the thin film transistors comprising:

a semiconductor layer formed on an insulating surface, the semiconductor layer comprising crystallized silicon and having source, drain and channel regions therein wherein the channel region comprises a plurality of crystals extending in a direction in parallel with the insulating surface; and a gate electrode adjacent to the channel region with a gate insulating film interposed therebetween, wherein the extending direction of the crystals and a carrier flow direction in the channel region form an acute angle, and wherein the crystal growth direction in the channel region of the first thin film transistor coincides with that of the second thin film transistor.

23. The semiconductor device according to claim 22 wherein the semiconductor layer contains a metal element selected from the group consisting of Ni, Fe, Co, Pd and Pt.

24. The semiconductor device according to claim 22 wherein the gate electrode is located over the channel region.

25. The semiconductor device according to claim 22 wherein the first thin film transistor is an N-channel type thin film transistor and the second thin film transistor is a P-channel type thin film transistor.

26. The semiconductor device according to claim 22 wherein the semiconductor layer has a thickness of 500 to 1500 Å.

* * * * *